(12) United States Patent
Yun et al.

(10) Patent No.: US 9,691,742 B2
(45) Date of Patent: Jun. 27, 2017

(54) DISPLAY DEVICE AND METHOD OF MANUFACTURING THE SAME

(71) Applicant: SAMSUNG DISPLAY CO., LTD., Yongin-si, Gyeonggi-do (KR)

(72) Inventors: Jong Hyun Yun, Gwangmyeong-si (KR); Sung Sik Bae, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/975,579

(22) Filed: Dec. 18, 2015

(65) Prior Publication Data
US 2016/0225839 A1    Aug. 4, 2016

(30) Foreign Application Priority Data
Jan. 29, 2015   (KR) .................. 10-2015-0014352

(51) Int. Cl.
| | | |
|---|---|---|
| H01L 25/13 | (2006.01) | |
| H01L 27/32 | (2006.01) | |
| H01L 21/027 | (2006.01) | |
| H01L 33/38 | (2010.01) | |
| H01L 25/075 | (2006.01) | |

(52) U.S. Cl.
CPC ............ *H01L 25/13* (2013.01); *H01L 21/027* (2013.01); *H01L 25/0756* (2013.01); *H01L 27/3267* (2013.01); *H01L 27/3276* (2013.01); *H01L 33/382* (2013.01); *H01L 33/387* (2013.01)

(58) Field of Classification Search
CPC . H01L 25/0756; H01L 25/13; H01L 27/3267; H01L 27/3276; H01L 33/382; H01L 33/387
See application file for complete search history.

(56) References Cited

U.S. PATENT DOCUMENTS

| | | |
|---|---|---|
| 4,690,510 A | 9/1987 | Takamatsu et al. |
| 6,614,171 B2 | 9/2003 | Rajeswaran et al. |
| 7,362,046 B2 | 4/2008 | Aston |
| 7,994,524 B1 * | 8/2011 | Chung .................. H01L 27/156 257/100 |

(Continued)

FOREIGN PATENT DOCUMENTS

| | | | |
|---|---|---|---|
| CN | 203386808 U | * | 1/2014 |
| KR | 10-2006-0064318 A | | 6/2006 |

(Continued)

*Primary Examiner* — Allan R Wilson
(74) *Attorney, Agent, or Firm* — Lewis Roca Rothgerber Christie LLP

(57) ABSTRACT

A method of manufacturing a display device includes: forming a plurality of photoresist columns at an upper edge region of a glass substrate by a photo patterning process; coating a plastic chemical liquid on an entire upper surface of the glass substrate to cover the photoresist columns; evaporating a solvent of the plastic chemical liquid to semi-harden a plastic substrate and to expose an upper portion of the photoresist columns; forming a plurality of through-holes at an edge region of the surface of the semi-hardened plastic substrate by removing the photoresist columns; firing and curing the plastic chemical liquid to form the plastic substrate; and coating a metal layer on an edge region of the surface of the plastic substrate with the through-holes.

4 Claims, 7 Drawing Sheets

(56) References Cited

U.S. PATENT DOCUMENTS

| | | |
|---|---|---|
| 8,305,294 B2 | 11/2012 | Cok et al. |
| 2002/0171620 A1* | 11/2002 | Gordon, II .............. G02F 1/167 345/107 |
| 2004/0263064 A1* | 12/2004 | Huang ................ H01L 27/3267 313/504 |
| 2005/0007508 A1* | 1/2005 | Saitou ............... G02F 1/136227 349/38 |
| 2007/0159070 A1* | 7/2007 | Hu ........................ H01L 25/048 313/504 |
| 2007/0237200 A1* | 10/2007 | Ryu ........................ H01S 5/405 372/50.122 |
| 2009/0296349 A1* | 12/2009 | Suzuki ................ H05K 1/0206 361/705 |
| 2014/0103313 A1* | 4/2014 | Ma .......................... H01L 51/52 257/40 |
| 2016/0044751 A1* | 2/2016 | Ikeda .................... H05B 33/02 362/227 |

FOREIGN PATENT DOCUMENTS

| | | |
|---|---|---|
| KR | 10-2011-0023138 A | 3/2011 |
| KR | 10-2012-0042151 A | 5/2012 |
| KR | 10-2012-0059575 A | 6/2012 |
| KR | 10-2013-0122624 A | 11/2013 |

\* cited by examiner

DISPLAY DEVICE AND METHOD OF MANUFACTURING THE SAME

CROSS-REFERENCE TO RELATED APPLICATION

This application claims priority to and the benefit of Korean Patent Application No. 10-2015-0014352 filed in the Korean Intellectual Property Office on Jan. 29, 2015, the entire contents of which are incorporated herein by reference.

BACKGROUND

1. Field

The present disclosure relates to a display device and a method of manufacturing the same.

2. Description of the Related Art

Most of the existing flexible display products on the market are organic light emitting diode (OLED) display products using plastic substrates. A flexible OLED display is formed by the same process as the existing OLED display with additional processes of coating the plastic substrate on a glass, depositing a thin film transistor (TFT) and an organic layer, and detaching the plastic substrate. The plastic substrate coated on the glass has high heat resistance to satisfy heat resistance to a thin film transistor process using low temperature poly silicon (LIPS).

A process of producing the plastic substrate on the carrier glass, hereinafter, referred to as a PI process may be divided into three processes. The three processes include a first process of coating a polyimide solution (polyamic acid solute+NMP solvent mixed at an appropriate ratio) on the glass, a second process of evaporating the solvent at an optimized ratio, and a third process of preparing a film having high heat resistance through high-temperature firing. When the PI process is completed, the OLED display device manufacturing process is performed by forming the plastic film on the glass.

Currently, the display device is manufactured through depositing and patterning on the glass, and commercial products are produced with varying sizes from 1 inch to 60 inches. A large-sized product requires a carrier substrate that is larger than the product size, and a defect ratio may increase relative to an increase in size of the substrate.

Most connection type display devices are connected by overlapping display devices and by using low-resolution LCDs. Many flexible display devices use overlapping low-resolution LCDs in parallel. However, the overlapping portions of the display devices are typically transparent and may use various different driving techniques.

Thus, techniques to manufacture and connect small-sized substrates have been developed. For example, a method of coupling glasses, in which an upper glass has a larger size, and a method of compensating a non-emission area of an edge part by tilting light emitted in the lower glass have been studied. However, it may be difficult to connect a driving line, the display device needs to be transparent, and an additional program is required during driving.

The above information disclosed in this Background section is only for enhancement of understanding of the background of the invention and may contain information that does not form prior art.

SUMMARY

Embodiments according to the present invention provide a display device and a manufacturing method thereof. An aspect of the present invention is directed to an operation of preparing a lower electrode below a plastic substrate through patterning before preparing the plastic substrate and easily generating a contact hole (e.g., a through-hole) by using a specific characteristic in a process of evaporating the plastic substrate.

According to one or more embodiments of the present invention, a method of manufacturing a display device includes: forming a plurality of photoresist columns at an upper edge region of a glass substrate by a photo patterning process; coating a plastic chemical liquid on an entire upper surface of the glass substrate to cover the photoresist columns; evaporating a solvent of the plastic chemical liquid to semi-harden a plastic substrate and to expose an upper portion of the photoresist columns; forming a plurality of through-holes at an edge region of the surface of the semi-hardened plastic substrate by removing the photoresist columns; firing and curing the plastic chemical liquid to form the plastic substrate; and coating a metal layer on an edge region of the surface of the plastic substrate with the through-holes, wherein a plurality of plastic substrates are connect-assembled with each other through the through-holes.

The plastic chemical liquid may include polyimide (PI).

The plastic chemical liquid may be coated on the substrate by a slit coating method.

The photoresist column may have a tapered shape or a reverse tapered shape.

The solvent of the plastic chemical liquid may be evaporated at a temperature between about 90° C. and about 100° C.

The plastic chemical liquid may be fired at a temperature between about 400° C. and about 450° C.

The metal layer may include at least one of aluminum (Al), gallium (Ga), indium (In), titanium (Ti), molybdenum (Mo), and zinc (Zn).

The method of manufacturing may further include separating the glass substrate and the plastic substrate from each other.

The method of manufacturing may further include forming a display element or pixels on the plastic substrate.

According to one or more embodiments of the present invention, a method of manufacturing a display device includes: forming a plurality of hollow metal columns at an upper edge region of a glass substrate; coating a plastic chemical liquid on an entire upper surface of the glass substrate to cover the metal columns; evaporating a solvent of the plastic chemical liquid to semi-harden a plastic substrate and to expose upper portions of the metal columns; and firing and curing the plastic chemical liquid to form the plastic substrate.

The plastic chemical liquid may include polyimide (PI).

The plastic chemical liquid may be coated on the substrate by a slit coating method.

The solvent of the plastic chemical liquid may be evaporated at a temperature between about 90° C. and about 100° C.

The plastic chemical liquid may be fired at a temperature between about 400° C. and about 450° C.

The metal column may include at least one of aluminum (Al), gallium (Ga), indium (In), titanium (Ti), molybdenum (Mo), and zinc (Zn).

The method of manufacturing may further include separating the glass substrate and the plastic substrate from each other.

The method of manufacturing may further include forming a display element or pixels on the plastic substrate.

According to one or more embodiments of the present invention, a display device includes: a plurality of upper substrates, each of the upper substrates including a display element on a first surface and a plurality of through-holes coated with a metal layer at an edge region of a second surface, the second surface opposite to the first surface; and a plurality of lower substrates, each of the lower substrates including a third surface, and wherein a display element, pixels, and a plurality of electrodes are at an edge region of each third surface and are connected through the plurality of through-holes of the upper substrate.

The upper substrate and the lower substrate may include polyimide.

The through-hole may have a tapered shape or a reverse tapered shape.

The metal layer may include at least one of aluminum (Al), gallium (Ga), indium (In), titanium (Ti), molybdenum (Mo), and zinc (Zn).

The display element may include a thin film transistor.

The display element may include at least one of an organic light emitting display element, a liquid crystal display element, and an electrophoretic display element.

According to one or more embodiments of the present invention, the lower electrode is formed on the plastic substrate by patterning prior to preparing the plastic substrate, the substrates can be easily connected to each other via contact holes (e.g., the through-holes), and a large-sized display device can be easily produced through the substrate connection structure.

Further, if a substrate has a defect, the substrate connection structure according to one or more embodiments of the present invention allows for replacement of the substrate having the defect, which may reduce cost of repair of the display device and replacement of the entire substrate may not be required.

Further, the substrates may be assembled in various shapes. As such, development costs for changing models of the display device may be reduced, and it is possible to increase yield and improve production efficiency.

Further, additional equipment investments for the enlargement of the display device are likely not required because an existing production line may be used.

Further, easy movement and connection are possible during assembly.

DETAILED DESCRIPTION

Figure 1:
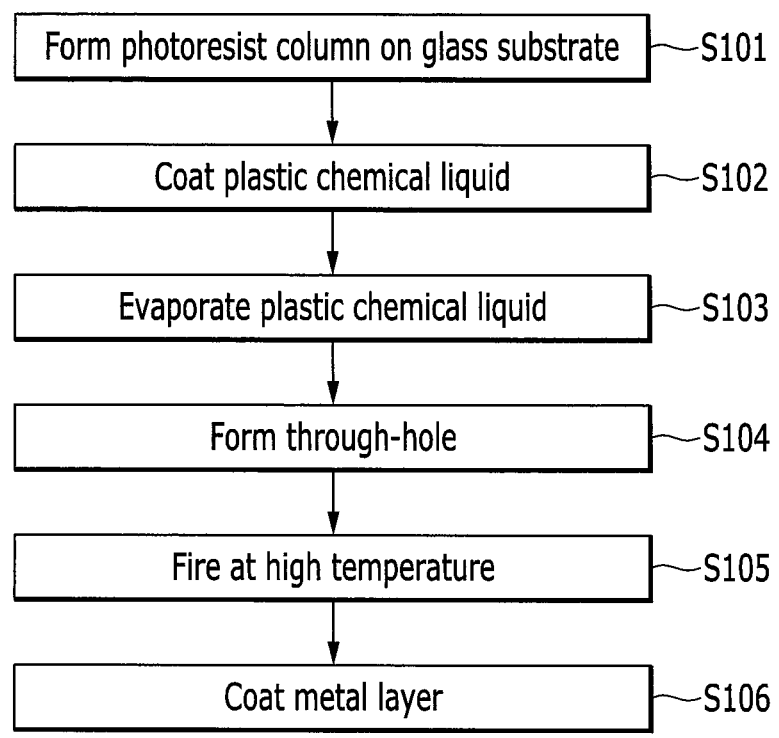
FIG. 1 is a flowchart of a manufacturing method of a display device according to one or more exemplary embodiments of the present invention.

The present invention is described more fully hereinafter with reference to the accompanying drawings, in which exemplary embodiments of the invention are shown. As those skilled in the art would realize, the described embodiments may be modified in various different ways, all without departing from the spirit or scope of the present invention.

Further, in exemplary embodiments, because like reference numerals designate like elements having the same configuration, a first exemplary embodiment is representatively described, and in other exemplary embodiments, the description may focus on configurations that are different from the first exemplary embodiment.

The drawings are schematic, and are not drawn to scale. Relative dimensions and ratios of portions in the drawings may be exaggerated or reduced in size for clarity and convenience, and any dimension is an example and is not limiting. In addition, like structures, elements, or components illustrated in two or more drawings may use like reference numerals for like features. It will be understood that when an element or layer is referred to as being "on," or "connected to" another element or layer, it can be directly on or connected to the other element or layer, or one or more intervening elements or layers may be present.

The terminology used herein is for the purpose of describing particular embodiments only and is not intended to be limiting of the invention. As used herein, the singular forms, "a" and "an" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. The use of "may" when describing embodiments of the present invention refers to "one or more embodiments of the present invention." Also, the term "exemplary" is intended to refer to an example or illustration.

As used herein, the terms "substantially," "about," and similar terms are used as terms of approximation and not as terms of degree, and are intended to account for the inherent variations in measured or calculated values that would be recognized by those of ordinary skill in the art. As used herein, the term "and/or" includes any and all combinations of one or more of the associated listed items. Expressions such as "at least one of," when preceding a list of elements, modify the entire list of elements and do not modify the individual elements of the list.

The exemplary embodiments disclosed herein are examples. As a result, various modifications of the drawings are within the scope and spirit of the invention. Thus, the exemplary embodiments are not limited to any specific aspect of an illustration. For example, suitable modifications of an aspect of manufacturing are contemplated herein.

Hereinafter, a flexible display device according to one or more exemplary embodiments of the present invention is described with reference to FIGS. 1 to 2E.

FIG. 1 is a flowchart of a method of manufacturing a display device according to one or more exemplary embodiments of the present invention, and FIGS. 2A to 2E are cross-sectional views of a method of manufacturing the display device according to one or more exemplary embodiments of the present invention.

Figure 2A:
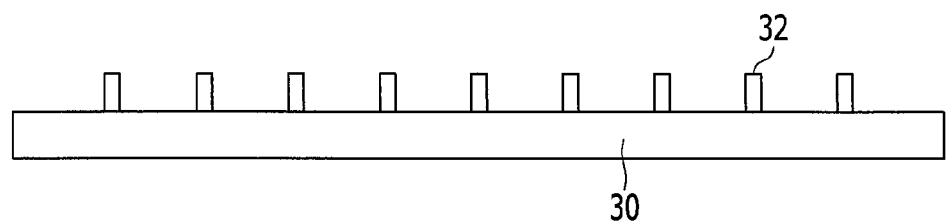
FIGS. 2A to 2E are cross-sectional views of a manufacturing method of a display device according to one or more exemplary embodiments of the present invention.
Figure 2B:
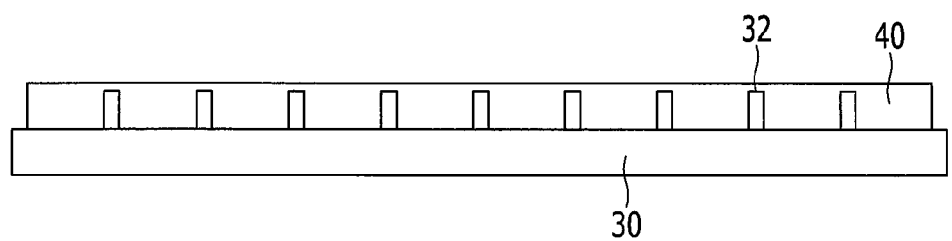
Figure 2C:
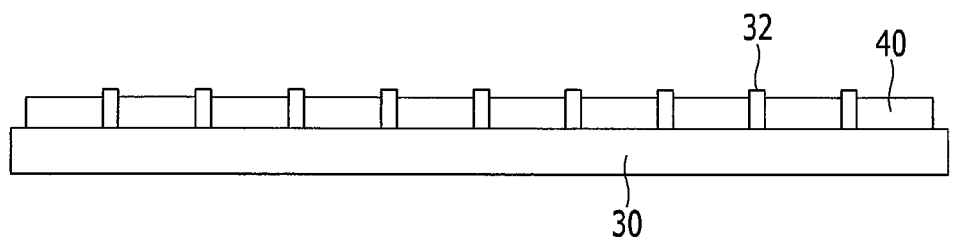
Figure 2D:
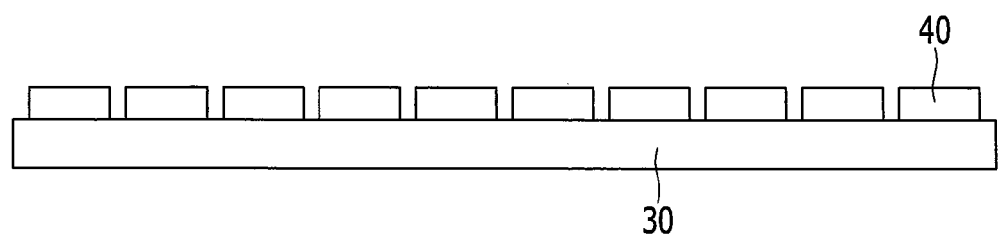
Figure 2E:
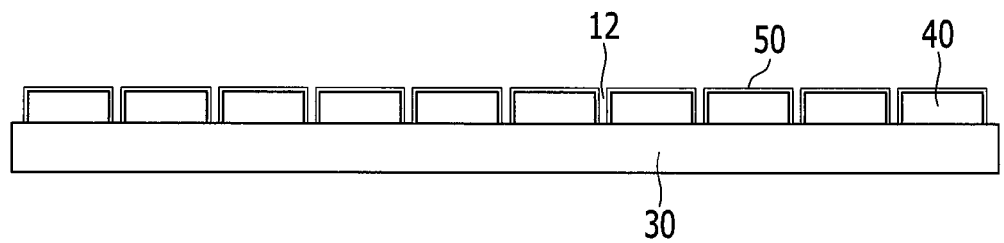

Referring to FIGS. 1 to 2E, a method of manufacturing a display device includes forming a photoresist column (S101), coating a plastic chemical liquid (S102), evaporating the plastic chemical liquid (S103), forming a through-hole (S104), firing and curing (S105), and coating a metal layer (S106).

First, a plurality of photoresist columns 32 is formed on a glass substrate 30 (S101). The plurality of photoresist columns 32 is formed at an edge (or an edge region) of the glass substrate 30 and formed through a photo patterning process using a mask.

Thereafter, a plastic chemical liquid 40 is coated on the entire surface of a glass substrate 30, including the edge region of the glass substrate 30 with the photoresist columns 32 (S102). The plastic chemical liquid 40 covers (or substantially covers) the photoresist columns 32 and has a height that is larger than the height of the photoresist columns 32. The plastic chemical liquid 40 may include polyimide, and during curing, a flexible plastic substrate may be formed. The plastic chemical liquid 40 may be coated on the glass substrate 30 by a silt coating method. A polyamic acid solute and a N-Methylpyrrolidone (NMP) solvent which are mixed at an appropriate ratio may be ejected and coated on the glass substrate 30 from a slit die.

Thereafter, the solvent of the plastic chemical liquid 40 is evaporated and the plastic substrate is semi-hardened so that upper portions of each of the photoresist columns 32 are exposed to the surface. The solvent of the plastic chemical liquid 40 may be evaporated at a low temperature (or a relatively low temperature) so that the photoresist columns 32 are substantially not affected. For example, the solvent of the plastic chemical liquid 40 may be evaporated at a temperature of about 90° C. to about 100° C. The solvent of the plastic chemical liquid 40 may be evaporated by controlling pressure, temperature, and/or time of exposure using high voltage direct current (HVCD) equipment. The higher the heat conductivity of the photoresist when the solvent is evaporated, less plastic film exists around the photoresist column 32 due to a coffee ring effect (for example, at the upper portions of the photoresist columns 32), and the upper portions of the photoresist columns 32 may be exposed by appropriately evaporating the solvent.

Figure 7:
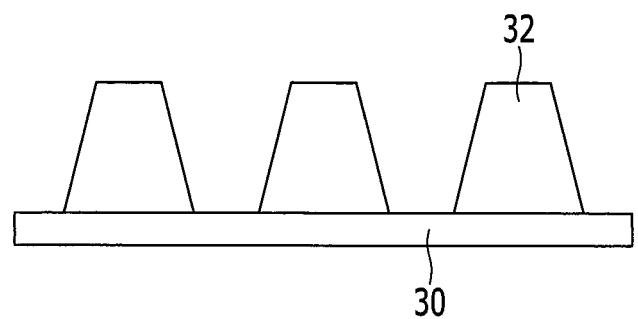
FIG. 7 is a cross-sectional view of a photoresist column according to one or more exemplary embodiments of the present invention.
Figure 8:
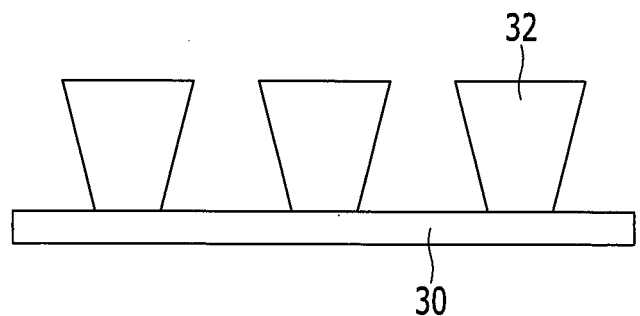
FIG. 8 is a cross-sectional view of a photoresist column according to one or more exemplary embodiments of the present invention.

Thereafter, a plurality of through-holes 12 are formed at an edge (or an edge region) of the surface of the semi-hardened plastic substrate by removing the photoresist columns 32. The photoresist columns 32 may have cylindrical shapes, or may have tapered shapes, such that a cross-sectional area of the photoresist column 32 increases from the upper portion to a lower portion thereof or may be reverse tapered, as illustrated in FIGS. 7 and 8. As such, when the photoresist columns 32 are removed, the shapes of the through-holes 12 may be cylindrical, tapered, or reverse tapered.

Thereafter, the plastic chemical liquid 40 coated on the glass substrate 30 is fired and cured at a high temperature (e.g., at a relatively high temperature) to form the plastic substrate (S105). In one embodiment, the plastic chemical liquid 40 is fired and cured at between about 400° C. and about 450° C.

Thereafter, the metal layer 50 is coated on the edge region of the surface of the plastic substrate with the through-holes 12 (S106). The metal layer 50 may be coated on insides of the through-holes 12 of the edge region of the surface of the plastic substrate. The metal layer 50 may include at least one of aluminum (Al), gallium (Ga), indium (In), titanium (Ti), molybdenum (Mo), and zinc (Zn), or a combination thereof. The conductors may be deposited by sputtering or vaporization and may be patterned by a mask or photolithography.

After firing and curing (S105), for example, after coating the metal layer (S106), the method of manufacturing may further include separating the glass substrate 30 and the plastic substrate from each other, and/or may further include forming a display element or pixels on the plastic substrate.

Figure 3:
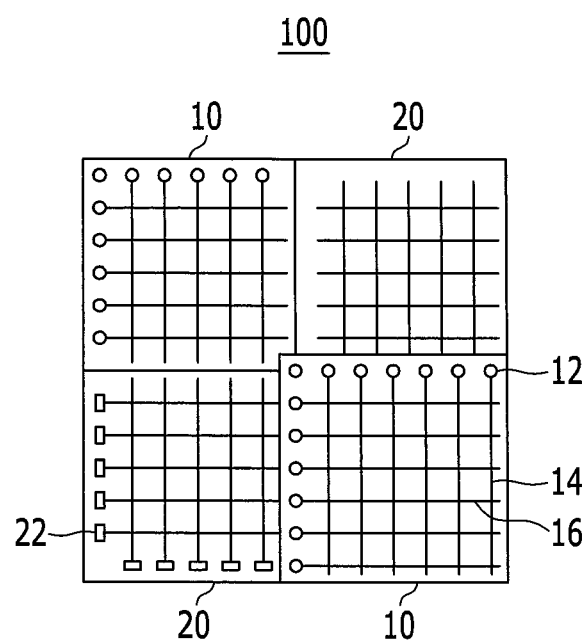
FIG. 3 is a schematic plan view of a display device according to one or more exemplary embodiments of the present invention.
Figure 4:
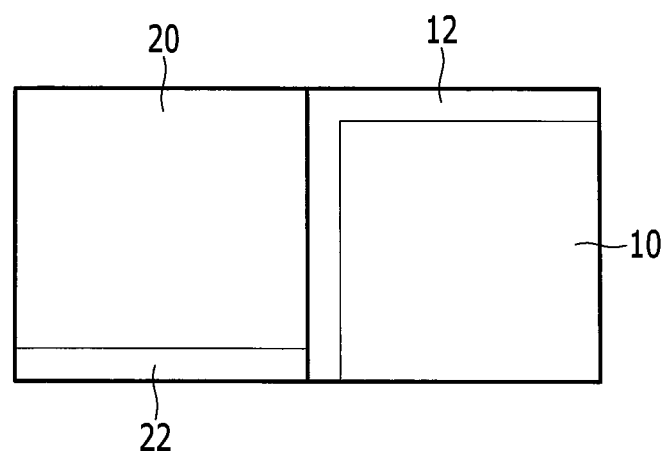
FIG. 4 is a schematic plan view of a substrate coupling structure of the display device according to one or more exemplary embodiments of the present invention.
Figure 5:
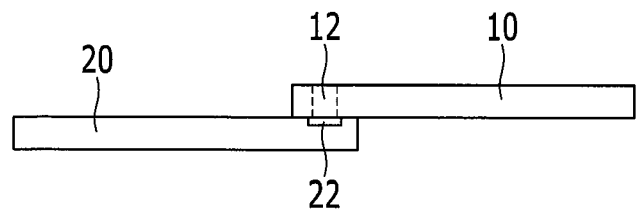
FIG. 5 is a schematic cross-sectional view of the substrate coupling structure of the display device according to one or more exemplary embodiments of the present invention.

FIG. 3 is a schematic plan view of a display device according to one or more exemplary embodiments of the present invention, FIG. 4 is a schematic plan view of a substrate coupling structure of the display device according to one or more exemplary embodiments of the present invention, and FIG. 5 is a schematic cross-sectional view of the substrate coupling structure of the display device according to one or more exemplary embodiments of the present invention.

Referring to FIGS. 3 to 5, a display device 100 includes a plurality of upper substrates 10 and a plurality of lower substrates 20. The upper substrate 10 includes a display device on a surface thereof, (e.g., a first surface) and a plurality of through-holes 12 at an edge region (e.g., a portion of a periphery). The edge region where the through-holes 12 are formed is coated with the metal layer 50 at another surface (e.g., a second surface opposite to the first surface of the upper substrate 10). In the lower substrate 20, a display element, a pixel, and a plurality of electrodes 22 are formed at an edge (or an edge region) of a surface (e.g., a third surface), and the plurality of electrodes 22 is connected with wires of the upper substrate 10 through the through-holes 12 of the upper substrate 10. In other words, in some embodiments, the display device 100 may include a plurality of upper substrates 10, each of the upper substrates 10 including a display element on a first surface and a plurality of through-holes 12 coated with a metal layer 50 at an edge region of a second surface, the second surface opposite to the first surface, and a plurality of lower substrates 20, each of the lower substrates 20 including a third surface, and wherein a display element, pixels, and a plurality of electrodes are at an edge region of each third surface and are connected through the plurality of through-holes 12 of the upper substrate 10. The upper substrate 10 and the lower substrate 20 each include a plurality of data lines 14 and a plurality of scan lines 16 in the display area. The data lines 14 and the scan lines 16 formed on the lower substrate 20 are connected with the plurality of electrodes 22 of the lower substrate 20, and the data lines 14 and scan lines 16 formed on the upper substrate 10 are connected with the plurality of electrodes 22 of the lower substrate 20 through the through-holes 12 of the upper substrate 10. As illustrated in FIG. 3, the display device 100 may include two upper substrates 10 and two lower substrates 20 connected to each other, but the number of substrates 10 and 20 is not limited thereto and the shapes of the substrates 10 and 20 may be any suitable shape.

The upper substrate 10 and the lower substrate 20 may be made of a plastic material including polyimide. Further, the through-hole 12 of the upper substrate 10 may have a hollow cylindrical shape, or may have a tapered shape wherein a cross-sectional area of the contact hole 12 increases from the top to the bottom, or a reverse tapered shape, wherein the cross-sectional area of the contact hole 12 decreases from the top to the bottom.

The metal layer 50 formed on the upper substrate 10 may include at least one of aluminum (Al), gallium (Ga), indium (In), titanium (Ti), molybdenum (Mo), and zinc (Zn), or a combination thereof.

The display elements of the upper substrate 10 and the lower substrate 20 may include thin film transistors, and the display element may be one of an organic light emitting display element, a liquid crystal display element, and an electrophoretic display element.

Figure 6:
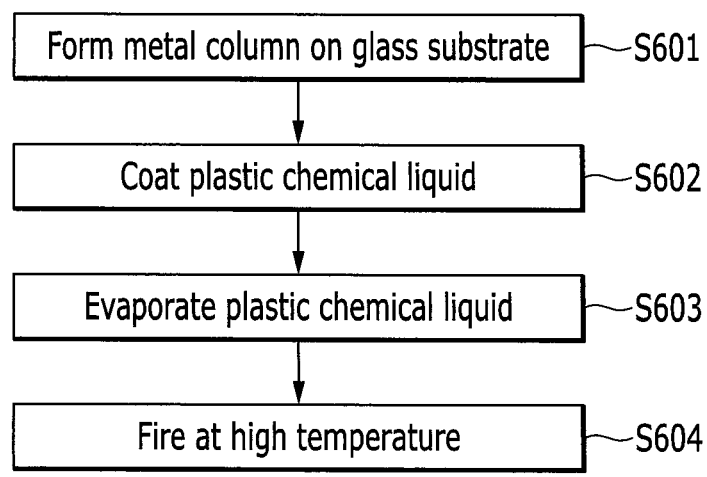
FIG. 6 is a flowchart of a manufacturing method of a display device according to one or more exemplary embodiments of the present invention.

FIG. 6 is a flowchart of a method of manufacturing a display device according to one or more exemplary embodiments of the present invention. Referring to FIG. 6, the manufacturing method of the display device includes forming a metal column (S601), coating a plastic chemical liquid (S602), evaporating the plastic chemical liquid (S603), and firing and curing (S604). In one or more exemplary embodiments, instead of forming a photoresist column, an operation of forming a column made of metal is performed prior to coating the plastic chemical liquid.

First, a plurality of hollow metal columns is formed at an upper edge (or an upper edge region) of the glass substrate 30 (S601). The metal columns each provide a contact line passing through the inside of the plastic substrate. The metal column may include at least one of aluminum (Al), gallium (Ga), indium (In), titanium (Ti), molybdenum (Mo), and zinc (Zn), or a combination thereof. The metal columns may have tapered shapes such that a cross-sectional area of the metal column increases from an upper portion to a lower portion thereof, or may have reverse tapered shapes such that the cross-sectional area of the metal column decreases from the upper portion to the lower portion, similar to the shapes of the photoresist columns 32 illustrated in FIGS. 7 and 8 and discussed above.

Thereafter, the plastic chemical liquid 40 is coated on the entire upper surface of the glass substrate 30 to cover the metal columns (S602). The plastic chemical liquid 40 covers the metal columns and has a height that is larger than a height of the metal columns. The plastic chemical liquid 40 may include polyimide, and a flexible plastic substrate may be formed during curing. The plastic chemical liquid 40 may be coated on the upper surface of the glass substrate 30 by a silt coating method. A polyamic acid solute and a N-Methylpyrrolidone (NMP) solvent that are mixed at an appropriate ratio may be ejected and coated on the glass substrate 30 from a slit die.

Thereafter, the solvent of the plastic chemical liquid 40 is evaporated and the plastic substrate is semi-hardened so that the respective upper portions of the metal columns are exposed to the surface (S603). The solvent of the plastic chemical liquid 40 may be evaporated at a temperature of about 90° C. and about 100° C. The solvent of the plastic chemical liquid 40 may be evaporated by controlling pressure, temperature, and/or time of exposure using high voltage direct current (HVCD) equipment.

Thereafter, the plastic chemical liquid 40 coated on the glass substrate 30 is fired and cured at a high temperature to form the plastic substrate (S604). In one or more exemplary embodiments, the plastic chemical liquid 40 is fired and cured at between about 400° C. and about 450° C.

After firing and curing (S604), the method of manufacturing may further include separating the glass substrate 30 and the plastic substrate from each other, and may further include forming a display element or pixels on the plastic substrate.

FIG. 7 is a cross-sectional view of a photoresist column according to one or more embodiments of the present invention, and FIG. 8 is a cross-sectional view of a photoresist column according to one or more exemplary embodiments of the present invention.

As illustrated in FIGS. 7 and 8, the photoresist columns 32 may have tapered shapes in which a cross-sectional area of the photoresist column 32 increases from the upper portion to the lower portion thereof, or reverse tapered shapes, wherein the cross-sectional area of the photoresist column 32 decreases from the upper portion to the lower portion thereof.

In one or more exemplary embodiments, the photoresist column 32 may have a cylindrical shape, but the present invention is not limited thereto. Similarly, the shape of the metal column according to one or more exemplary embodiments may be a tapered shape, a reverse tapered shape, or a cylindrical shape, like the shape of the photoresist column 32 as illustrated in FIGS. 7 and 8, but the present invention is not limited thereto.

As such, the display device and the method of manufacturing the same according to one or more exemplary embodiments of the present invention provide substrates that may be easily connected to each other, and a large-sized display device may be easily produced through the substrate connection structure. Further, if a substrate has a defect, the substrate connection structure according to one or more exemplary embodiments of the present invention allows for replacement of the substrate having the defect, which may reduce cost of repair of the display device and replacement of the entire substrate may not be required. Further, the substrates may be assembled in various shapes as needed. As such, development costs for changing models of the display device may be reduced, and it is possible to increase yield and improve production efficiency. Further, additional equipment investments for the enlargement of the display device are likely not required because an existing production line may be used. Even further, easy movement and connection are possible during assembly.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims and their equivalents.

DESCRIPTION OF SOME OF THE SYMBOLS ACCORDING TO NON-LIMITING EMBODIMENTS

100: Display device
10: Upper substrate
12: Through-hole
14: Data line
16: Scan line
20: Lower substrate
22: Electrode
30: Glass substrate
32: Photoresist column
40: Plastic chemical liquid
50: Metal layer

What is claimed is:

1. A display device comprising:
   a plurality of upper substrates, each of the upper substrates comprising a display element on a first surface and a plurality of through-holes coated with a metal layer at an edge region of a second surface, the second surface opposite to the first surface; and
   a plurality of lower substrates, each of the lower substrates comprising a third surface, and wherein a display element, pixels, and a plurality of electrodes are at an edge region of each third surface and are connected through the plurality of through-holes of the upper substrate.

2. The display device of claim 1, wherein the upper substrate and the lower substrate comprise polyimide.

3. The display device of claim 1, wherein the through-hole has a tapered shape or a reverse tapered shape.

4. The display device of claim 1, wherein the metal layer comprises at least one of aluminum (Al), gallium (Ga), indium (In), titanium (Ti), molybdenum (Mo), and zinc (Zn).

* * * * *